(12) United States Patent
Kourtakis et al.

(10) Patent No.: US 8,362,353 B2
(45) Date of Patent: Jan. 29, 2013

(54) PHOTOVOLTAIC MODULE WITH MULTI-LAYER FLUOROPOLYMERIC FILM

(75) Inventors: Kostantinos Kourtakis, Media, PA (US); Mark E. Lewittes, Wilmington, DE (US); Jose Manuel Rodriguez-Parada, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 504 days.

(21) Appl. No.: 12/640,719

(22) Filed: Dec. 17, 2009

(65) Prior Publication Data

US 2010/0154868 A1      Jun. 24, 2010

Related U.S. Application Data

(60) Provisional application No. 61/139,661, filed on Dec. 22, 2008.

(51) Int. Cl.
    *H01L 31/042*      (2006.01)
(52) U.S. Cl. ......... 136/251; 136/244; 136/246; 428/698
(58) Field of Classification Search .................. 136/244, 136/246, 251; 428/698; 359/586
    See application file for complete search history.

(56) References Cited

U.S. PATENT DOCUMENTS

| | | | |
|---|---|---|---|
| 5,846,650 A | 12/1998 | Ko et al. | |
| 6,657,691 B2 | 12/2003 | Ochiai et al. | |
| 6,680,080 B1 | 1/2004 | Belleville | |
| 6,815,056 B2 | 11/2004 | Choi et al. | |
| 6,924,037 B1 * | 8/2005 | Joret et al. | 428/432 |
| 7,910,215 B2 * | 3/2011 | Reymond et al. | 428/428 |
| 2006/0147177 A1 | 7/2006 | Jing et al. | |
| 2006/0147674 A1 | 7/2006 | Walker, Jr. et al. | |
| 2006/0147729 A1 | 7/2006 | Mizuno | |
| 2006/0275627 A1 | 12/2006 | Biteau et al. | |
| 2007/0172646 A1 | 7/2007 | Tanabe et al. | |
| 2007/0285778 A1 | 12/2007 | Walker et al. | |
| 2007/0286994 A1 | 12/2007 | Walker et al. | |

FOREIGN PATENT DOCUMENTS

| | | |
|---|---|---|
| EP | 1168004 A2 | 1/2002 |
| EP | 1624022 A1 | 2/2006 |
| JP | 19911266801 A | 11/1991 |
| JP | 08122504 A | 5/1996 |
| JP | 2004326100 A | 11/2004 |
| JP | 2006035624 A | 2/2006 |
| JP | 2006058453 A | 3/2006 |
| JP | 2007086455 A | 4/2007 |
| JP | 2007121993 A | 5/2007 |
| JP | 2007272131 A | 10/2007 |
| JP | 2007293313 A | 11/2007 |
| WO | 2006030720 A1 | 3/2006 |
| WO | 2007004818 A1 | 1/2007 |

OTHER PUBLICATIONS

The Yasui Seiki "Micro Gravure(tm)" Coating Method, Yasui Next Generation of Coaters, Yasui Seiki Co., (USA), 2333 Industrial Drive, Suite 24A3, Bloomington, IN 47404, pp. 1-10.
U.S. Appl. No. 12/747,172, filed Jun. 10, 2010.
U.S. Appl. No. 12/747,175, filed Jun. 10, 2010.
U.S. Appl. No. 12/747,178, filed Jun. 10, 2010.

\* cited by examiner

*Primary Examiner* — Vu A Nguyen

(57) ABSTRACT

The present invention discloses photovoltaic modules with a multi-layer fluoropolymeric film wherein the reflectance spectrum of the multi-layer fluoropolymeric film exhibits at least one minimum in the wavelength between 400 and 1100 nm. The film is useful as a light capture front sheet in solar modules, and more broadly as an antireflection layer. The invention further discloses photovoltaic arrays formed from such modules.

24 Claims, 7 Drawing Sheets

PHOTOVOLTAIC MODULE WITH MULTI-LAYER FLUOROPOLYMERIC FILM

FIELD OF THE INVENTION

The present invention is directed to a photovoltaic array useful in solar energy applications made up of photovoltaic modules each provided with a glass front sheet that has a multi-layer fluoropolymeric film disposed upon the outer surface.

BACKGROUND OF THE INVENTION

Photovoltaic cells are semiconductor devices that directly convert incident light from the ultra-violet through the infrared into electricity via the photovoltaic effect. Solar cells are a particular category of photovoltaic cells that are utilized to convert sunlight into electricity. In a typical solar energy application, a plurality of solar cells—usually hundreds or thousands—are combined into a single structural and electrical unit known as a solar panel, or more generally, a photovoltaic module.

A photovoltaic module employed for solar power generation is typically of the order of 3 feet×5 feet×1 inch (1 m×1.5 m×0.025 m) in size, although in principle it can be any size consistent with safe handling and electrical safety of the installed system. Normally a solar energy installation will constitute a photovoltaic array that includes a plurality of such modules, from perhaps 25 on a residential roof to hundreds or even thousands for major power installations. The output from a single module made up of polycrystalline silicon photocells is 4-5 amperes of direct current at a voltage of 24 volts.

A significant reflectance loss occurs at the front surface of a glass front sheet of a solar panel. Cumulative (i.e. in a full day) reflectance loss of as much as 4-10% may result due to angle of incidence effects. Increasing the amount of incident light transmitted through the glass to the photovoltaic cells beneath can increase the energy output from the solar panel. Even small percentage changes are considered significant in the solar energy industry.

It is known in the art to employ so-called anti-reflection (AR) coatings on reflective substrates in order to reduce the intensity of reflected light.

Copending applications 61/015,069, 61/015,074, 61/015,080, and 61/015,063 disclose various aspects of an antireflection coating comprising two layers, each layer comprising a fluoropolymer, particularly a fluoroelastomer, and wherein one the layer further comprises nano-scale inorganic particles (nanoparticles), the layer containing nanoparticles being characterized as having a higher refractive index than the layer not containing nano-particles. Further disclosed therein is an antireflection coating disposed upon various non-fluorinated organic polymeric substrates as well as glass.

U.S. Pat. No. 6,680,080 discloses deposition of single layer fluoropolymer film by solution deposition onto soda-lime glass and phosphate glasses in particular. Teflon® copolymers are recited.

Patent applications assigned to the 3M company (US2007/0286994, US2007/0285778, and US2006/0275627) disclose bilayer AR films having a low refractive index comprising a fluorinated material and a high refractive index layer comprising nano-scale inorganic particles. The high refractive index layer does not comprise a fluorinated material. Deposition on glass is disclosed.

JP1991266801(A) discloses a multi-layer fluoropolymeric structure employed as an AR coating. The multi-layer coating disclosed is an inorganic dielectric film antireflection coating disposed upon a reflective substrate such as glass. Disposed upon the inorganic dielectric film is a fluoropolymer film 3—100 nanometers (nm) in thickness. Further disclosed is an antireflective film created on the surface of a base material that consists of a single or multi layered inorganic dielectric thin film. When it is a single layer, it is made from a material which has a lower refractive index (normally η is 1.3-1.5) than the base material. In the case of two layers, a material with a higher refractive index (normally η is 1.9-2.4) comes next to the base material followed by a material with a lower refractive index. When it is three layered, a material with a medium refractive index (normally η is 1.5-1.9) comes next to the base material followed by a material with a high refractive index, and a material with a low refractive index comes last. The thicknesses of each inorganic dielectric thin film layer is disclosed as follows (where λ is a design wavelength): λ/4 for a single layered film; λ/2 and λ/4 from the base side for a two layered film; and λ/4, λ/2, and λ/4 from the base side for a three layered film.

There is a need for fluoropolymer antireflective films for use in the solar power industry. The present invention fulfills such need.

SUMMARY OF THE INVENTION

The invention provides a photovoltaic module comprising
  a back sheet,
  a front sheet,
  a layer comprising a plurality of photovoltaic cells disposed between the front sheet and the back sheet,
  conductive pathways disposed to combine the electrical output of the plurality of photovoltaic cells into an electrical output from the module; and,
  an electrical output disposed to interconnect the module with other modules to form a photovoltaic array, or with an external electrical load;
  the back sheet, front sheet, and layer of photovoltaic cells being laminated together
  and wherein the front sheet comprises a glass sheet having a front surface, a multi-layer fluoropolymeric film disposed on the front surface, and an adhesive layer disposed between the front surface and the multi-layer fluoropolymeric film, the multi-layer fluoropolymeric film comprising
    a first fluoropolymeric layer having a refractive index of 1.45 to 1.50 and a thickness greater than about 10 micrometers, the first fluoropolymeric layer comprising a first fluoropolymer; and
    a second fluoropolymeric layer having a refractive index of 1.33 to 1.37 and a thickness of 100 to 150 nanometers, the second fluoropolymeric layer comprising a second fluoropolymer;
    with the proviso that the reflectance spectrum of the multi-layer fluoropolymeric film exhibits at least one minimum in the wavelength between 400 and 1100 nm;
  Further described is a photovoltaic array comprising
  a support structure
  a plurality of electrically interconnected photovoltaic modules mechanically affixed to the support structure, each photovoltaic module comprising
    a back sheet,
    a front sheet,
    a layer comprising a plurality of photovoltaic cells disposed between the front sheet and the back sheet,
    conductive pathways disposed to combine the electrical output of the plurality of photovoltaic cells into an electrical output from the module;

an electrical output disposed to interconnect the module with other modules to form the photovoltaic array;

the back sheet, front sheet, and layer of photovoltaic cells being laminated together and wherein the front sheet comprises a glass sheet having a front surface, a multi-layer fluoropolymeric film disposed on the front surface, and an adhesive layer disposed between the front surface and the multi-layer fluoropolymeric film, the multi-layer fluoropolymeric film comprising a first fluoropolymeric layer having a refractive index of 1.45 to 1.50 and a thickness greater than about 10 micrometers, the first fluoropolymeric layer comprising a first fluoropolymer; and a second fluoropolymeric layer having a refractive index of 1.33 to 1.37 and a thickness of 100 to 150 nanometers, the second fluoropolymeric layer comprising a second fluoropolymer;

with the proviso that the reflectance spectrum of the multi-layer fluoropolymeric film exhibits at least one minimum between 400 and 1100 nm;

and, an electrical output to permit connection to an external electrical circuit.

Still further is described a method comprising illuminating a photovoltaic module with light in the wavelength range from 400 to 1100 nm; and, connecting the thus illuminated photovoltaic module to an electrical load thereby forming an electrical circuit, the photovoltaic module comprising a back sheet, a front sheet, a layer comprising a plurality of photovoltaic cells disposed between the front sheet and the back sheet, conductive pathways disposed to combine the electrical output of the plurality of photovoltaic cells into an electrical output from the module;

an electrical output disposed to interconnect the module with other modules to form a photovoltaic array, or with an external electrical load;

the back sheet, front sheet, and layer of photovoltaic cells being laminated together and wherein the front sheet comprises a glass sheet having a front surface, a multi-layer fluoropolymeric film disposed on the front surface, and an adhesive layer disposed between the front surface and the multi-layer fluoropolymeric film, the multi-layer fluoropolymeric film comprising a first fluoropolymeric layer having a refractive index of 1.45 to 1.50 and a thickness greater than about 10 micrometers, the first fluoropolymeric layer comprising a first fluoropolymer; and a second fluoropolymeric layer having a refractive index of 1.33 to 1.37 and a thickness of 100 to 150 nanometers, the second fluoropolymeric layer comprising a second fluoropolymer;

with the proviso that the reflectance spectrum of the multi-layer fluoropolymeric film exhibits at least one minimum between 400 and 1100 nm.

In one embodiment, the multi-layer fluoropolymeric film further comprises a third fluoropolymeric layer disposed between the first fluoropolymeric layer and the second fluoropolymeric layer.

DETAILED DESCRIPTION

Figure 1:
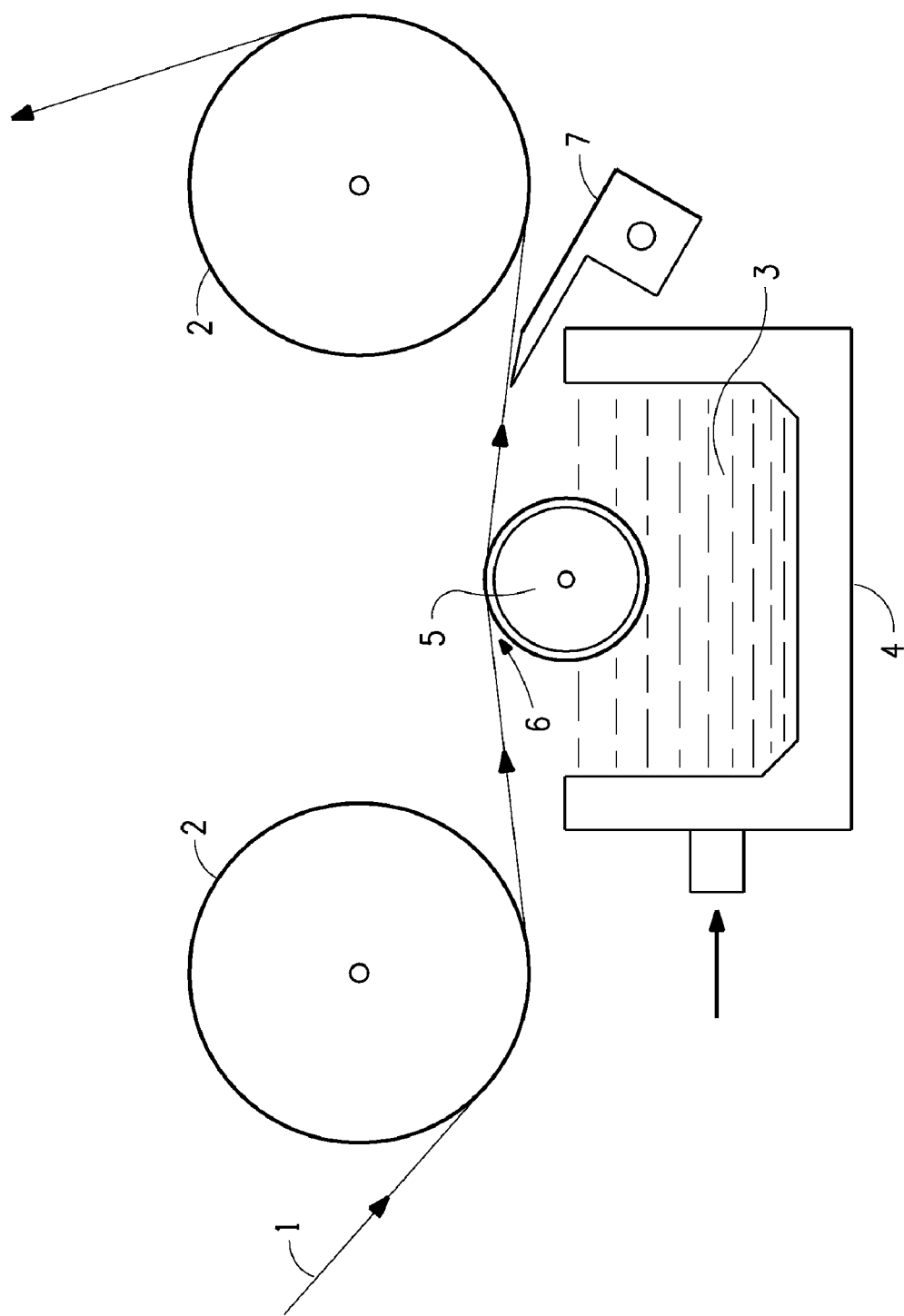
FIG. 1 is a schematic representation of the Micro Gravure™ process employed for the preparation of the multi-layer fluoropolymeric film.

Solar panels, depending upon where they are deployed, are subject to various heating and cooling cycles, ultraviolet (UV) irradiation, wind, rain, snow, and the other depredations associated with weather and exposure. To be cost-effective, solar panels must endure these assaults for at least a decade, and preferably longer. Fluorinated polymers are known to be highly inert; many are highly transparent and particularly well-suited for use on exposed surfaces in solar energy applications.

The photovoltaic module employed in the instant invention provides improved efficiency versus a photovoltaic module of the art that is the same in all respects but wherein the exterior surface of glass front sheet does not have disposed upon it the multi-layer fluoropolymeric film.

Solar panels generally come in two forms, thermal solar in which the heat from solar radiation is employed to heat a heat transfer fluid; and, photovoltaic in which solar radiation is converted to electrical current. While the present disclosure is directed primarily to photovoltaic solar energy applications, the invention as described applies also to improving the efficiency and durability of thermal solar installations.

The photovoltaic module employed in the invention provides particular benefits in solar energy applications, including but not limited to:

the high weatherability associated with fluorinated materials;

an increase in light transmission versus bare glass across the visible spectrum by at least 1.5 and as much as 4%;

the cost-efficiency and convenience associated with the manufacture, storage, shipping, and lamination of roll or sheet stock.

simple application of anti-reflection coating by the solar panel manufacturer.

In one aspect, the photovoltaic module comprises a back sheet, a front sheet, a layer comprising a plurality of photovoltaic cells disposed between the front sheet and the back sheet, conductive pathways disposed to combine the electrical output of the plurality of photovoltaic cells into an electrical output from the module;

an electrical output disposed to interconnect the module with other modules to form a photovoltaic array;

the back sheet, front sheet, and layer of photovoltaic cells being laminated together and wherein the front sheet comprises a glass sheet having a front surface, a multi-layer fluoropolymeric film disposed thereupon, and an adhesive layer disposed between the surface and the film, the multi-layer fluoropolymeric film comprising a first fluoropolymeric layer having a refractive index in the range of 1.45 to 1.50, and having a thickness greater than about 10 micrometers, the first fluoropolymeric layer comprising a first fluoropolymer; and a second fluoropolymeric layer having a refractive index of 1.33 to 1.37, and having a thickness in the range of 100 to 150 nanometers, the second fluoropolymeric layer comprising a second fluoropolymer which may be the same as or different from the first fluoropolymer;

with the proviso that the reflectance spectrum of the multi-layer fluoropolymeric film exhibit at least one minimum in the wavelength range from 400 to 1100 nm.

In one embodiment, the multi-layer fluoropolymeric film further comprises a third fluoropolymeric layer disposed between the first fluoropolymeric layer and the second fluoropolymeric layer and in contact with both, the third fluoropolymeric layer comprising a third fluoropolymer which may be the same as or different from the second fluoropolymer, and may have 50 to 60 vol-% of one or more nano-scale particulate inorganic oxide or nitride. The third fluoropolymeric layer may have a refractive index of 1.50 to 1.70, and a thickness of 1 to 240 nanometers.

In a further embodiment the one or more nano-scale particulate inorganic oxide or nitride comprises an acryloyl siloxyl functionalized surface.

There is a distinction between the function of reducing reflectance and increasing light capture. In those embodiments of the multi-layer fluoropolymeric film suitable for use in improving the efficiency of solar panels, the fluoropolymeric layers must be highly transparent. In practical terms this means that both light scattering and spectroscopic absorbance must be minimized in the wavelength range from 400 to 1100 nm. This is achieved by selection of materials that are inherently low absorbance across the visible spectrum, processing the fluoropolymers to minimize the development of spherulitic crystals and the like that scatter light, selecting inorganic oxides or nitrides of a size well-below visible wavelengths, and minimizing contamination during processing. It has been found in the practice of the invention that fluoropolymeric layers exhibiting haze below 0.6% according to ASTM D1003-07e1, provide the desired enhancement of light transmission in photovoltaic modules.

For the purposes of the present invention the terms "glass" and "glass sheet" shall refer to an amorphous, inorganic material characterized by a transmittance of electromagnetic radiation of at least 90% in the wavelength range from 400 to 1100 nm. A glass shaped article can be of any desired shape, including but not limited to display screens such as computer monitors, optical components such as camera lenses, telescope optics and the like, and glass sheeting useful as a top plate, also known as a coversheet, of a photovoltaic module.

There is no particular limitation on the thickness of the glass sheet from the viewpoint of operability of the present invention, but it is desirable that the sheet be sufficiently thick to be self supporting, and both thick and tough enough to ensure durability in the desired end-use. Suitable glass sheets are characterized by a refractive index of 1.5 or higher. Refractive index as herein recited is determined at a wavelength of 650 nm.

The selection of suitable glass depends upon the type of photovoltaic cell employed. Photovoltaic cell technology and the related glass technology are very well known in the art, and will not be repeated here. By way of summary, for the purposes of glass selection, photovoltaic cells can be divided into two groups: wafer cells and thin film cells. Wafer cells are formed by slicing poly-crystalline or the more-expensive single-crystal silicon ingots into wafers of about 250 micrometer thickness, followed by doping with, e.g., phosphorus, screen-printing wiring elements, and combining with other such wafers in an encapsulant, followed by placing between the back sheet—usually a polymeric film construction such as so called TPT, or Tedlar°/PET/Tedlar®—and a glass front sheet. Usually the interior surface of the glass front sheet, and, often, of the polymeric back sheet, is textured in such manner as to enhance light scattering internally thus confining stray light to the interior, increasing the probability that it will be incident upon the photovoltaic cell.

A suitable glass sheet for use as the front sheet in a solar panel based upon wafer-type photovoltaic cells is a type of soda-lime glass known as "float glass". Float glass suitable for use in wafer type solar panels can be purchased from AFG, PPG, St. Gobain, and other glass manufacturers. Some vendors offer float glass sheeting particularly manufactured for use in solar panels. These glasses generally have been treated to reduce the iron content, and may contain solarization additives such as Ce or Sb.

Thin film photovoltaic cells are prepared by vapor deposition and annealing processes onto a substrate that is subject to temperatures of about 600° C. Very often the substrate is the inner surface of the glass front-sheet itself. It has been found that float glass undergoes undesirable distortion at 600° C. In the case of thin film photovoltaic cells, it has been found that borosilicate glass exhibits the desirable properties for high temperature exposure. Borosilicate glass is more expensive than float glass.

Typical materials employed in thin film photovoltaic cell technology include but are not limited to amorphous silicon, $CdTe$, $CuInSe_2$, and $CuInGaSe_2$ The surface of the glass sheeting employed as a substrate for thin film photovoltaic cells is desirably treated with a conductive surface treatment to collect the photoelectrons without reducing the voltage being produced. Suitable materials for use in the conductive surface treatment include indium tin oxide, aluminum zinc oxide, and, less expensive but less uniform, iron tin oxide.

The term "coating" refers to a layer residing on the surface of another layer. A coating as employed herein has a thickness of less than 400 nm. Coatings of those dimensions are too fragile to be handled as a separate film but rather require a support layer. Thus, the first fluoropolymeric layer provides the necessary mechanical support for convenient handling of the coatings that are deposited thereon according to the processes of the invention.

The first fluoropolymeric layer may be made up of fluoropolymer and one or more nanoscale inorganic oxide or nitride so that the refractive index of the first fluoropolymeric layer is in the range of 1.45 to 1.50 as determined by the simple rule of mixtures, namely $$\eta_{TOTAL} = VF_1 \times \eta_1 + VF_2 \times \eta_2 + VF_p \times \eta_p$$

where $\eta_{TOTAL}$ represents the refractive index of the first fluoropolymeric layer, $VF_{1,2\ and\ p}$ are respectively the volume fractions of a first inorganic oxide or nitride, a second inorganic oxide or nitride, and of the first fluoropolymer; and, $\eta_{1,2,\ and\ p}$ are respectively the refractive indices of the first inorganic oxide or nitride, the second inorganic oxide or nitride, and of the first fluoropolymer.

Alternatively, the first fluoropolymeric layer may consist essentially of a fluoropolymer that itself has a refractive index in the range of 1.45 to 1.47. One example of a polymer film having a refractive index in the range of 1.45 to 1.47 is poly(vinyl fluoride) available from DuPont as Tedlar® PVF film.

In one embodiment, the second fluoropolymer is not cross-linked. In an alternative embodiment, the second fluoropolymer is cross-linked. To achieve good layer to layer adhesion, superior coating durability, dimensional stability, and utility, it is preferred that the second fluoropolymer is cross-linked. In a further embodiment, the second fluoropolymer is a cross-linked fluoroelastomer. In a still further embodiment, the second fluoropolymer is a cross-linked terpolymer of vinylidene fluoride, hexafluoropropylene, and tetrafluoroethylene comprising 50-85% of monomer units derived from vinylidene fluoride. A suitable fluoropolymer for use as the second fluoropolymer is Viton® B Fluoroelastomer available from DuPont. Viton® B Fluoroelastomer is characterized by a refractive index in the range of 1.34 to 1.36.

In one embodiment of the invention, the refractive index of the first fluoropolymeric layer is in the range of 1.455 to 1.465. In a still further embodiment, the refractive index of the second fluoropolymeric layer is in the range of 1.34 to 1.36.

In one embodiment, the multi-layer film further comprises a third fluoropolymeric layer disposed between the first fluoropolymeric layer and the second fluoropolymeric layer and in adhering contact with both, the third fluoropolymeric layer comprising a third fluoropolymer, which may be the same as or different from the second fluoropolymer, and 50 to 60 vol-% of one or more nano-scale particulate inorganic oxide or nitride, the third fluoropolymeric layer having a refractive index of 1.50 to 1.70, and having a thickness in the range of 0 to 240 nanometers.

In an alternative embodiment the third fluoropolymer is an amorphous copolymer of tetrafluoroethylene and perfluorodioxole available as Teflon® AF from the DuPont Company.

In a further embodiment, the second and third fluoropolymer are the same. In one embodiment the second and third fluoropolymers are perfluoroelastomers. In one embodiment, the second and third fluoropolymers are the same perfluoroelastomer. In a further embodiment the second and third fluoropolymers are the same cross-linked perfluoroelastomer. In a still further embodiment, the cross-linked fluoroelastomer is a cross-linked terpolymer of vinylidene fluoride, hexafluoropropylene, and tetrafluoroethylene comprising 50-85% of vinylidene fluoride monomer units.

Suitable inorganic oxides and nitrides for use as nano-scale particulates include BN, ZrN, $Ti_2O_3$, $TiO_2$, $ZrO_2$, $Al_2O_3$, $Sb_2O_3$, $Sb_2O_4$, $Sb_2O_5$, $SnO_2$, $SnO$, $In_2O_3$, $ZnO$, $SiO_2$, indium tin oxide, antimony tin oxide, mixed titanium/tin/zirconium oxides, and binary, ternary, quaternary and higher order composite oxides of one or more cations selected from Ti, Al, Sb, Zr, In, Sn, Nb, Ta, and Zn. More than one type of nanoparticle may be used in combination. In other cases, nanoparticle composites (e.g. single or multiple core/shell structures) can be used, in which one oxide encapsulates another oxide in one particle. Since different oxides are characterized by different refractive indices, several different combinations of suitable oxides will allow the practitioner to arrive at a particular refractive index target using the simple rule of mixtures, supra.

In one embodiment, the particulate nano-scale inorganic oxide or nitride comprises $TiO_2$ characterized by a median equivalent spherical diameter of <90 nm. In a further embodiment the $TiO_2$ is characterized by a median equivalent spherical diameter in the range of 5 to 60 nm. In a still further embodiment, the $TiO_2$ is characterized by a median equivalent spherical diameter in the range of 5 to 40 nm.

In an alternative embodiment the particulate nano-scale inorganic oxide comprises $ZrO_2$ characterized by a median equivalent spherical diameter of <90 nm. In a further embodiment the $ZrO_2$ is characterized by a median equivalent spherical diameter in the range of 5 to 60 nm. In a still further embodiment, the $ZrO_2$ is characterized by a median equivalent spherical diameter in the range of 5 to 40 nm.

Suitable particulate nano-scale inorganic oxides and nitrides are available from commercial sources such as Nissan Chemical America Company (Houston, Tex., USA) and, Shokubai Kasei Kogyo Kabushiki Kaisha, Japan for nanoparticles functionalized with methacryloyl siloxy groups.

For the purposes of the present invention, the term "adheringly contacting" shall be understood to mean that one layer adheres sufficiently well to the layer to which it is adheringly contacted that contact between the layers is not broken during ordinary use in the application intended for the duration that is required in that application. The degree of adhesion between layers required for a particular use will depend upon the use. The use of an adhesive compound between the layers is not precluded according to the present invention; however, any such adhesive used must be highly transparent to solar radiation, and index-matched to one of the layers to which the adhesive compound adheres to minimize light scattering.

An adhesive composition is employed between the glass and the first fluoropolymeric layer. Suitable adhesives include Elvax® EVA resins and Surlyn® Ionomer resins containing standard UV stabilization packages, both available from the DuPont Company. Other suitable adhesives include other heat-activatable adhesives such as cross-linking adhesive or a thermally activated epoxy or urethane adhesive. Acrylic adhesives can be used.

Any of the fluoropolymeric layers can further contain the usual additives that are employed in polymeric compositions to provide benefits that are not directly related to the operability of the present invention. Such additives include but are not limited to polymer-soluble plasticizers, ultra-violet absorbers, flame retardants, and the like. However, all such additives must meet the criterion of not unacceptably degrading the optical clarity of the multi-layer fluoropolymeric film. While not an absolute criterion for utility, a value of haze of ≦0.6% according to ASTM D1003-07 is desirable for use of the present invention for solar energy applications. The use of any such additive must of course leave the refractive index of the layers within the ranges specified supra.

In one embodiment, the second and third fluoropolymers are the same, and the second fluoropolymeric layer and the third fluoropolymeric layer are disposed in a single stratified film layer, the stratified film layer having a polymer-poor lower stratum having a refractive index in the range of 1.50 to 1.70, and a polymer-rich upper stratum having a refractive index in the range of 1.33 to 1.37, the lower stratum adheringly contacting the first fluoropolymeric layer, the lower stratum comprising the third fluoropolymer and 50 to 60% by volume of nanoscale inorganic oxide or nitride particles, whereof the surface is functionalized with acryloyl siloxyl functionality.

In one embodiment, the refractive index of the first stratum is in the range of 1.55 to 1.65 and the refractive index of the second stratum is in the range of 1.34 to 1.36.

The functionalized particle surface according to the present invention is characterized by the presence on the surface of an acryloyl siloxyl radical represented by the formula

$$X—Y—Si(R_1)(R_2)—O— \quad (I)$$

where X is (CH$_2$=CHC(=O)O—) or (CH$_2$=C(CH$_3$)C(=O)O—), Y is a divalent organic radical selected from substituted and unsubstituted alkylene radicals having 2-10 carbons, and substituted or unsubstituted arylene groups having 6 to 20 carbons. Y can include ether, ester, and amide linkages. Suitable substituents include but are not limited to halogen, mercapto, carboxyl, alkyl, and aryl. $R_1$ and $R_2$ are independently selected from, —OH, —O—Si, —O—, C1-C20 alkoxy, C6-C20 aryloxy, C1-C20 alkyl, C6-C20 aryl, C7-C30 aralkyl, C7-C30 alkaryl, halogen, and hydrogen.

In one embodiment, Y is CH$_2$—CH$_2$—CH$_2$—, and $R_1$ and $R_2$ are methoxy, —OH, or —O—.

Also provided is a process for preparing a multi-layer fluoropolymeric film, the process comprising
combining one or more particulate inorganic oxides having surfaces and a third fluoropolymer with a solvent that dissolves the third fluoropolymer, to form a solution/dispersion,
wherein the one or more particulate inorganic oxide or nitride each is characterized by a median equivalent spherical diameter below 90 nanometers, an acryloyl siloxyl functionalzed surface; and the one or more particulate inorganic oxides having a combined refractive index of greater than 1.50; and,
wherein the concentration ratio of the one or more inorganic oxide to the third fluoropolymer is in the range of 1% to less than 60% by volume;
coating the solution/dispersion onto the surface of a first fluoropolymeric layer having a surface and comprising a first fluoropolymer, the first fluoropolymeric layer having a thickness of at least 10 micrometers, and having a refractive index in the range of 1.450 to 1.470;
allowing the coating layer to form a stratified bilayer coating; and,
extracting the solvent following the formation of the stratified bilayer coating to form a stratified bilayer coating having a thickness of less than 400 nanometers; and,
wherein the first fluoropolymer and the third fluoropolymer may be the same or different.

Suitable inorganic oxides and nitrides are described supra. Because optical scale uniformity is a highly desirable attribute of the multi-layer fluorinated films prepared according to the invention, it is preferred to employ high shear mixing processes for forming the particle dispersion in the solvent.

Surface functionalization is achieved by treating the particles of inorganic oxide or nitride with a reagent having the formula

$$X—Y—Si(R_1R_2R_3) \quad (II)$$

where X is (CH$_2$=CHC(=O)O—) or (CH$_2$=C(CH$_3$)C(=O)O—), Y is a divalent organic radical selected from substituted and unsubstituted alkylene radicals having 2-10 carbons, and substituted or unsubstituted arylene groups having 6 to 20 carbons. Y can include ether, ester, and amide linkages. Suitable substituents include but are not limited to halogen, mercapto, carboxyl, alkyl, and aryl. $R_1$ and $R_2$ are independently selected from C1-C20 alkoxy, C6-C20 aryloxy, C1-C20 alkyl, C6-C20 aryl, C7-C30 aralkyl, C7-C30 alkaryl, halogen, and hydrogen. $R_3$ is —OH or a readily hydrolyzable group including but not limited to C1-C20 alkoxy, C6-C20 aryloxy, or halogen.

In one embodiment, the compound (II) is first hydrolyzed to convert $R_3$ to —OH by means known in the art such as treatment with water in ethanol for a period of about 24 hours. The thus prepared hydrolysis mixture is then combined with a colloidal dispersion of the nanoscale particles in methyl isobutyl ketone (MIBK), as typically supplied by the manufacturer. The mixture is allowed to stand at 50° C. for about 24 hours to effect a high degree of surface functionalization. The mixture so prepared is then employed as-is, in the subsequent steps outlined below.

In the practice of the process, solution/dispersions having 8-14 weight-% solids content have been found well-suited for deposition of coatings less than 400 nm in thickness, as required in the present invention, using the microgravure coating technique.

In one embodiment, the process further comprises the step of cross-linking the coating after formation of the bilayer and before or coincident with the solvent extraction step. Several alternative means of achieving cross-linking in polymers are known in the art, any of which is suitable for the practice of the invention. Cross-linking may be accomplished by reacting a cross-linking agent with cross-linking sites incorporated into the uncross-linked fluoropolymer formed into the coating according to the first process. In an alternative, heat, UV or electron-beam irradiation can be used to activate an initiator that forms a diradical that reacts with a reactive site such as an unsaturated moiety on the polymer chain.

In a further embodiment, the third fluoropolymer comprises cross-linking sites. In a further embodiment the third fluoropolymer employed in the first process is an uncross-linked terpolymer of vinylidene fluoride, hexafluoropropylene, and tetrafluoroethylene comprising 50-85% of vinylidene fluoride monomer units having <1% of monomer units providing an iodine cure site. Suitable third fluoropolymers are available as Viton® B from the DuPont Company. The commercially available non-crosslinked terpolymer is supplied with a suitable cross-linking package.

It has been found that a combination of photoinitiator and cross-linking agent provides an effective package for preparing cross-linked fluoroelastomers suitable for the practice of the invention. For example, for curing Viton® B it has been found to be efficacious to employ 10 parts per hundred of triallyisocyanurate (TAIC) and 10 parts per hundred of a photoinitiator such as Irgacure® 907 from Ciba-Geigy. Fluoroelastomers are very well-known and in widespread commercial use. Detailed information about the preparation, cross-linking, and applications of fluoroelastomers is provided in *Fluoroelastomers Handbook: The Definitive User's Guide and Databook*, by A. Moore, William Andrew Publishing, ISBN 0-8155-1517-0 (2006). Some commercially available cross-linking packages do not provide an optically clear cross-linked polymer. Care must be taken to employ a cross-linking package that does not adversely affect transparency.

The solvent is selected such that it does not adversely affect the curing properties of the uncured composition or attack the first fluoropolymer. Additionally, the solvent is chosen such that the addition of the solvent to the uncured composition does not result in flocculation of the nanoparticles. Furthermore, the solvent should be selected such that it has an appropriate drying rate. That is, the solvent should not dry too slowly, which can undesirably delay the process of making an anti-reflective coating from the uncured composition. It should also not dry too quickly, which can cause defects such as pinholes or craters. It is found in the practice of the invention that polar aprotic organic solvents are well-suited for use in the processes. Suitable solvents include but are not limited to aliphatic and alicyclic ketones such as methyl ethyl ketone and methyl isobutyl ketone; esters such as propyl acetate; symmetric ethers and combinations thereof. Preferred solvents include propyl acetate and methyl isobutyl ketone.

Residual lower alkyl hydrocarbyl alcohols (e.g., methanol, ethanol, isopropanol, etc.) might be present on the nanoparticles after they have been functionalized. Any alcohol contamination of the solvent must be kept to below 8% by weight to avoid precipitation of the fluoroelastomer from the solution. Preferably alcohol is not present.

The nano-scale inorganic oxide particles can be any shape and remain substantially non-aggregated, They can be hollow, porous, or solid. Typically the median equivalent spherical diameter is less than about 90 nm, preferably less than 70 nm. Unless otherwise noted, particle sizes is determined by dynamic light scattering. This method reports data according to a volumetric particle size determination and determines the equivalent diameter of a sphere having the same volume. This method becomes unreliable for particles that deviate significantly from spherical, such as platelets. In cases of significantly non-spherical particles, a combination of electron microscopy and image analysis may provide a better way to characterize particles proposed for use in the present invention. Particle dimensions must be well-below that which would cause haze.

The process includes a step of coating the liquid mixture on a substrate to form a liquid mixture coating. In one embodiment, the step of coating can be carried out in a single coating step. Coating techniques useful for applying the uncured composition onto the substrate in a single coating step are those capable of forming a thin, uniform layer of liquid on a substrate, Suitable methods known in the art and in widespread use include but are not limited to direct or reverse gravure, reverse roll, die coaters, wire bar, knife or blade coaters.

Dip coating and Micro Gravure™ coating have been found to be particularly useful for the preparation of the highly uniform coatings required in the process herein. A Micro Gravure™ coating system, available from Yasui Seiki Company, Bloomington, Ind., provides a reverse wet kiss coating operation using gravure rolls that are 20 to 50 mm in diameter, and a metering blade for high shear, highly controlled coating. The schematic of the Micro Gravure™ process is shown in FIG. 1.

FIG. 1 depicts the first fluoropolymer layer substrate 1, with the arrows indicated the direction of motion, the guide rolls 2, the coating solution 3, in its reservoir 4, the rotating Micro Gravure™ roll 5, shown rotating counterclockwise and in kissing contact, at the point 6 with the moving substrate 1. The coating solution deposition is metered by a metering blade 7, that is positioned nearly tangent to the roll to skim the excess coating solution in a controlled manner.

The solvent can be extracted by any method known in the art, including but not limited to heating, application of vacuum to the coated sample, and convective flow of an inert gas, or a combination thereof.

After the solvent is removed, as discussed previously herein, the uncured coating is preferably cured by a free radical mechanism. Free radicals may be generated by known methods such as by the thermal decomposition of an organic peroxide, optionally included in the uncured composition, or by radiation such as ultraviolet (UV) radiation, gamma radiation, or electron beam radiation. Present uncured compositions are preferably UV cured due to the relative low cost and speed of this curing technique when applied on industrial scale.

The output as a function of incident wavelength of various photovoltaic cells available commercially is depicted in Perez-Lopez et al. Prog. Photovolt: Res. Appl. 2007; 15:303-315. Shown there are spectral responses of multi-crystalline Si (m-Si), amorphous thin film silicon(a-Si), CIGS and CdTe. Each of these photovoltaic cells exhibit performance over a broad range of wavelengths but the wavelength envelopes for maximum output differ one from the other. It is one of the objects of the present invention to provide a coating that provides improved transmission through the glass sheet of a photovoltaic module in the portion of the spectrum extending from about 400 to about 1100 nm. That is, the reflectance spectrum needs to show at least one broad minimum in the range of 400 to 1100 nm.

To work more effectively, it is advantageous that the minimum in the reflectance spectrum correspond to a maximum in the performance spectrum of the particular photovoltaic cell being employed. Thus, for example, if an amorphous silicon photocell exhibits a performance peak at around 550 nm, the coating should desirably exhibit a reflectance minimum that overlaps 550 nm.

The reflectance spectrum of the coating of the present invention is determined by the interplay of several parameters, namely the refractive indices of the bottom coating and the top coating, their relative thickness, and their absolute thickness. In the case of the bilayer coating, the relative thickness of the two layers is uniquely determined by the concentration of the nanoscale particles in the overall layer before separation of the layers occurs. Thus, according to the present invention, the nanoscale particles can range from 1 to 60 vol-% before separation of the layers, in order to ensure that the bottom coating layer will be thicker than the top coating layer. After separation (and cross-linking and solvent extraction), the bottom coating layer always has a concentration in the range of 50 to 60% by volume depending upon the particular nanoscale particles employed. Of course it is possible to incorporate both acryloyl siloxyl functionalized and non-functionalized particles so that some will separate and others will not, thereby having particles that affect the refractive index in both top and bottom coating layers. But that is a complexity best to be avoided unless it is absolutely necessary.

As shown supra, the refractive index of the bottom coating layer is determined by the respective refractive indices and volume fraction of each particulate and polymeric component. Because of the interaction between particle concentration, relative layer thickness, and refractive index in the first process, it is necessary to use two types of particles differing in refractive index so that refractive index can be varied while overall composition can be held constant.

The relative amounts of materials to be combined in the solution/dispersion starting composition, before coating, is computed from the following formula:

$$\eta_b = \left[ VF_1 \cdot \left( \frac{d_b}{d_b + d_t} \right)^{-1} \cdot \eta_1 \right] + \left[ VF_2 \cdot \left( \frac{d_b}{d_b + d_t} \right)^{-1} \cdot \eta_2 \right] + 0.4 \cdot \eta_{fl}$$

where $\eta_b$, is the refractive index of the bottom coating layer, $\eta_{fl}$ is the refractive index of the fluoropolymer, $\eta_1$ and $\eta_2$ are respectively the refractive indices of particulate nanoscale fillers 1 and 2. $d_b$ is the thickness of the bottom coating layer and $d_t$ is the thickness of the top coating layer. $VF_1+VF_2$ are respectively the volume fractions of the first and second inorganic oxide or nitride in the bottom and top coating layers combined.

$VF_1$ and $VF_2$ represent the respective volume fractions for each of nanoscale particles 1 and 2 in the overall feed compositions for the coating process. If we define $$\left(\frac{d_b}{d_b + d_t}\right) = C,$$

then the value of C is set according to the requisites of a particular application, and is determined to first order on the basis of fundamental wave optical considerations that are well-known in the art. Specific examples of C are described in the Examples provided below. According to the invention, $0 \leq d_b \leq 240$ nm, and $100 \leq d_t \leq 150$ nm.

The absolute thickness of the combined layers determines the location of the reflectance minima. The location of the reflectance minimum is tuned to the desired value as follows: the calculated relative amounts of particulate nanoscale oxides or nitrides are combined with the solution of the second fluoropolymer. The resulting solution dispersion is charged to the coating reservoir of the Micro Gravure™ coating apparatus. The manufacturer provides a calibration curve for wet thickness of the coating as a function of roll speed. The wet thickness is set for under 1 μm. The coating is then applied, cross-linked, solvent extracted, and then a specimen of the bilayer coated substrate is removed for off-line determination of reflectance spectrum. If the reflectance minimum is at a wavelength below the targeted range, then the coating thickness is increased by increasing the speed of the Micro Gravure™ roll, and the process repeated until the desired reflectance minimum is obtained.

While the procedure described above is a laboratory scale procedure, there is no reason that a continuous on-line or automated system could not be implemented to accomplish the same purposes more expeditiously. Such an on-line measurement process would be useful for quality control in a manufacturing setting.

In use, the multi-layer anti-reflection coated film produced according to the invention is laminated to the exterior of the glass front sheet of a photovoltaic module, providing improvement of 1.5% to 4% in solar radiation capture by the module. Lamination may be accomplished using index matched adhesives between the first fluoropolymer layer and the glass, as described supra.

Further provided is a process comprising
disposing upon the surface of a glass shaped article having a surface, a polymeric adhesive layer;
contacting the adhesive layer with a multi-layer fluoropolymeric film comprising
a first fluoropolymeric layer having a refractive index in the range of 1.45 to 1.50, and having a thickness greater than about 10 micrometers, the first fluoropolymeric layer comprising a first fluoropolymer; and
a second fluoropolymeric layer having a refractive index of 1.33 to 1.37, and having a thickness in the range of 100 to 150 nanometers, the second fluoropolymeric layer comprising a second fluoropolymer which may be the same as or different from the first fluoropolymer;
with the proviso that the reflectance spectrum of the multi-layer fluoropolymeric film exhibit at least one minimum in the wavelength range from 400 to 1100 nm;
applying heat and pressure; and,
forming an adhesive bond between the multi-layer fluoropolymeric film and the glass surface.

In one embodiment, the multi-layer fluoropolymeric film further comprises a third fluoropolymeric layer disposed between the first fluoropolymeric layer and the second fluoropolymeric layer and in adhering contact with both, the third fluoropolymeric layer comprising a third fluoropolymer which may be the same as or different from the second fluoropolymer, and 50 to 60 vol-% of one or more nano-scale particulate inorganic oxide or nitride, the third fluoropolymeric layer having a refractive index of 1.50 to 1.70, and having a thickness in the range of 1 to 240 nanometers.

In a further embodiment the one or more nano-scale particulate inorganic oxide or nitride comprises an acryloyl siloxyl functionalized surface.

The present invention provides a photovoltaic module comprising
a back sheet,
a front sheet,
a layer comprising a plurality of photovoltaic cells disposed between the front sheet and the back sheet,
conductive pathways disposed to combine the electrical output of the plurality of photovoltaic cells into an electrical output from the module;
an electrical output disposed to interconnect the module with other modules to form a photovoltaic array, or with an external electrical load;
the back sheet, front sheet, and layer of photovoltaic cells being laminated together;
and wherein the front sheet comprises a glass sheet having a front surface, a multi-layer fluoropolymeric film disposed thereupon, and an adhesive layer disposed between the surface and the film, the multi-layer fluoropolymeric film comprising
a first fluoropolymeric layer having a refractive index in the range of 1.45 to 1.50, and having a thickness greater than about 10 micrometers, the first fluoropolymeric layer comprising a first fluoropolymer; and
a second fluoropolymeric layer having a refractive index of 1.33 to 1.37, and having a thickness in the range of 100 to 150 nanometers, the second fluoropolymeric layer comprising a second fluoropolymer which may be the same as or different from the first fluoropolymer;
with the proviso that the reflectance spectrum of the multi-layer fluoropolymeric film exhibit at least one minimum in the wavelength range from 400 to 1100 nm.

In one embodiment, the multi-layer fluoropolymeric film further comprises a third fluoropolymeric layer disposed between the first fluoropolymeric layer and the second fluoropolymeric layer and in adhering contact with both, the third fluoropolymeric layer comprising a third fluoropolymer which may be the same as or different from the second fluoropolymer, and 50 to 60 vol-% of one or more nano-scale particulate inorganic oxide or nitride, the third fluoropolymeric layer having a refractive index of 1.50 to 1.70, and having a thickness in the range of 1 to 240 nanometers.

In a further embodiment the one or more nano-scale particulate inorganic oxide or nitride comprises an acryloyl siloxyl functionalized surface.

Figure 2A:
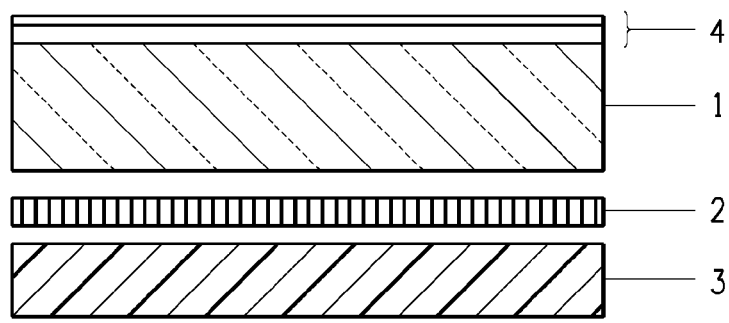
FIG. 2a is a schematic side view of an embodiment of the photovoltaic module of the invention.
Figure 2B:
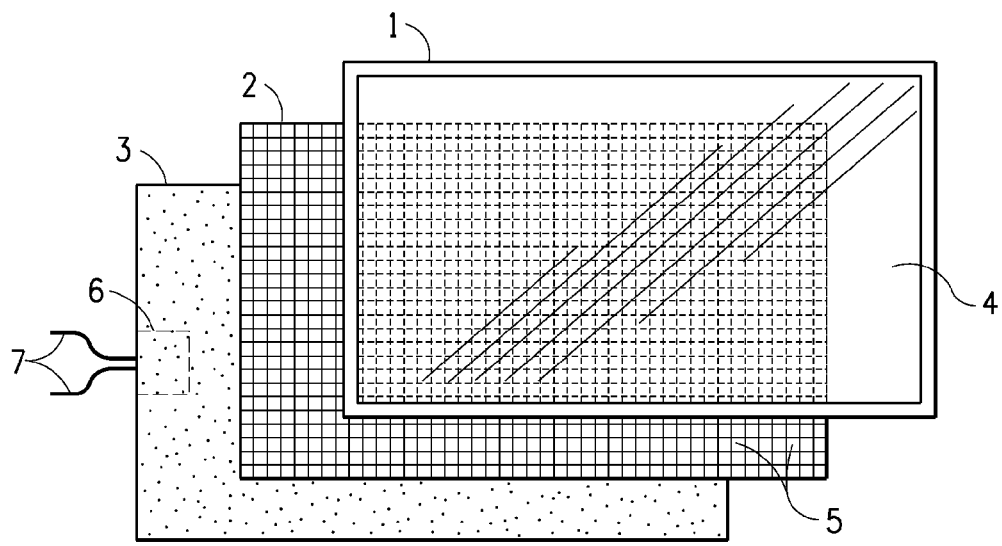
FIG. 2b is an offset, top-down view of the same embodiment of the photovoltaic module of the invention.

One embodiment of a photovoltaic module of the invention is depicted schematically in FIGS. 2A and 2B. FIG. 2A depicts a side view, showing the layers that make up the photovoltaic module based upon polycrystalline silicon photovoltaic cells. The front sheet 1 is normally made of glass, although it can also be polymeric. The interior surface of the glass may be textured to increase the light capture of the cell. The exterior surface of the glass may be coated, for example, as described infra. The photovoltaic cell layer 2 is positioned between the front sheet 1 and the normally opaque back sheet 3. In a 3 ft.×5 ft. module, there are normally 50-100 individual photovoltaic cells, normally embedded in an encapsulant material (not shown). A typical encapsulant material is ethylene vinyl acetate copolymer. The back sheet is often made of a multilayer polymeric composite structure comprising a layer of poly(ethylene terephthalate) between two layers of poly(vinyl fluoride). The multi-layer fluoropolymeric film 4 is shown in more detail in FIG. 3. The layers, 1, 2, 3, and 4 of FIG. 2A are normally laminated together, and the laminate enclosed in a frame (not shown). The frame may be metallic or non-metallic, such as reinforced plastic. The frame may serve both as an enclosing element and a structural element.

FIG. 2B shows a top view of the photovoltaic module, with the layers shown off-set from one another. Individual photovoltaic 5 cells make up the photovoltaic cell layer 2. Also shown is an electrical junction box 6, typically attached to the exterior of the back sheet, and high voltage, weatherproof connecting cables 7 extending therefrom. The output of the photovoltaic cells is combined through a grid of conductive pathways (not shown), combined and fed to the junction box. This box contains electrical signal conditioning components and connects the photovoltaic cell electrical output to the output cables 7. The module can be connected to an array comprising a plurality of modules, and eventually to an external electrical load.

Figure 3:
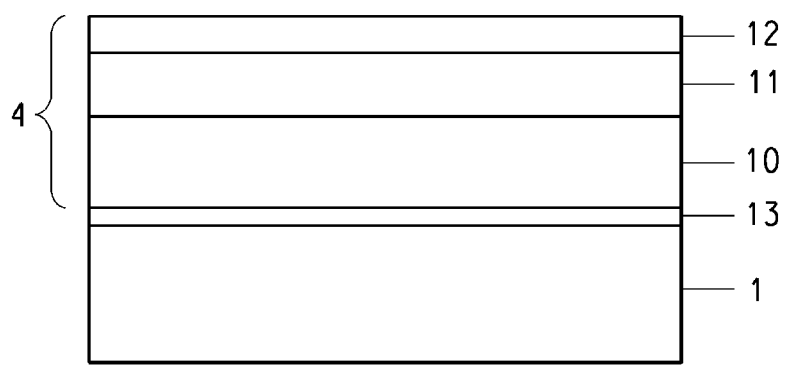
FIG. 3 is a magnified side view of an embodiment of the multi-layer fluoropolymeric film of the invention, represented in FIGS. 2a and 2b.

FIG. 3 shows a multi-layer fluoropolymeric film 4 disposed on an adhesive layer 13, which is in turn disposed on a front sheet 1. The multi-layer fluoropolymeric film 4 comprises a first fluoropolymer layer 10, an optional third fluoropolymer layer 11, and a second fluoropolymer layer 12.

In another aspect, the present invention provides a photovoltaic array comprising
 a support structure
 a plurality of electrically interconnected photovoltaic modules mechanically affixed to the support structure, each photovoltaic module comprising
  a back sheet,
  a front sheet,
  a layer comprising a plurality of photovoltaic cells disposed between the front sheet and the back sheet,
  conductive pathways disposed to combine the electrical output of the plurality of photovoltaic cells into an electrical output from the module;
  an electrical output disposed to interconnect the module with other modules to form a photovoltaic array, or with an external electrical load;
  the back sheet, front sheet, and layer of photovoltaic cells being laminated together
  and wherein the front sheet comprises a glass sheet having a front surface, a multi-layer fluoropolymeric film disposed thereupon, and an adhesive layer disposed between the surface and the film, the multi-layer fluoropolymeric film comprising
   a first fluoropolymeric layer having a refractive index in the range of 1.45 to 1.50, and having a thickness greater than about 10 micrometers, the first fluoropolymeric layer comprising a first fluoropolymer; and
   a second fluoropolymeric layer having a refractive index of 1.33 to 1.37, and having a thickness in the range of 100 to 150 nanometers, the second fluoropolymeric layer comprising a second fluoropolymer which may be the same as or different from the first fluoropolymer;
   with the proviso that the reflectance spectrum of the multi-layer fluoropolymeric film exhibit at least one minimum in the wavelength range from 400 to 1100 nm;
  and;
  an electrical output to permit connection to an external electrical circuit.

The basic requirements for a photovoltaic array are a support structure or framework to which the individual solar panels can be affixed, some way for electrically interconnecting the modules in series, and for the series circuits to be electrically interconnected in parallel. Preferably, the support framework will be oriented at an angle of 15-40° at temperate latitudes, with the angle adjustable to compensate for seasonal changes in the orientation of the sun. Preferably the materials of construction of the support framework, and of the solar panel, will be durable under conditions of weather and exposure over a period of 10-30 years.

The output of a photovoltaic array is a DC voltage. The output can be fed, via cables for example, directly to an external electrical load. More usefully the output is fed to an inverter that conditions the signal and converts the DC to AC voltage for use in operating household appliances, or feeding into the power grid.

Figure 4:
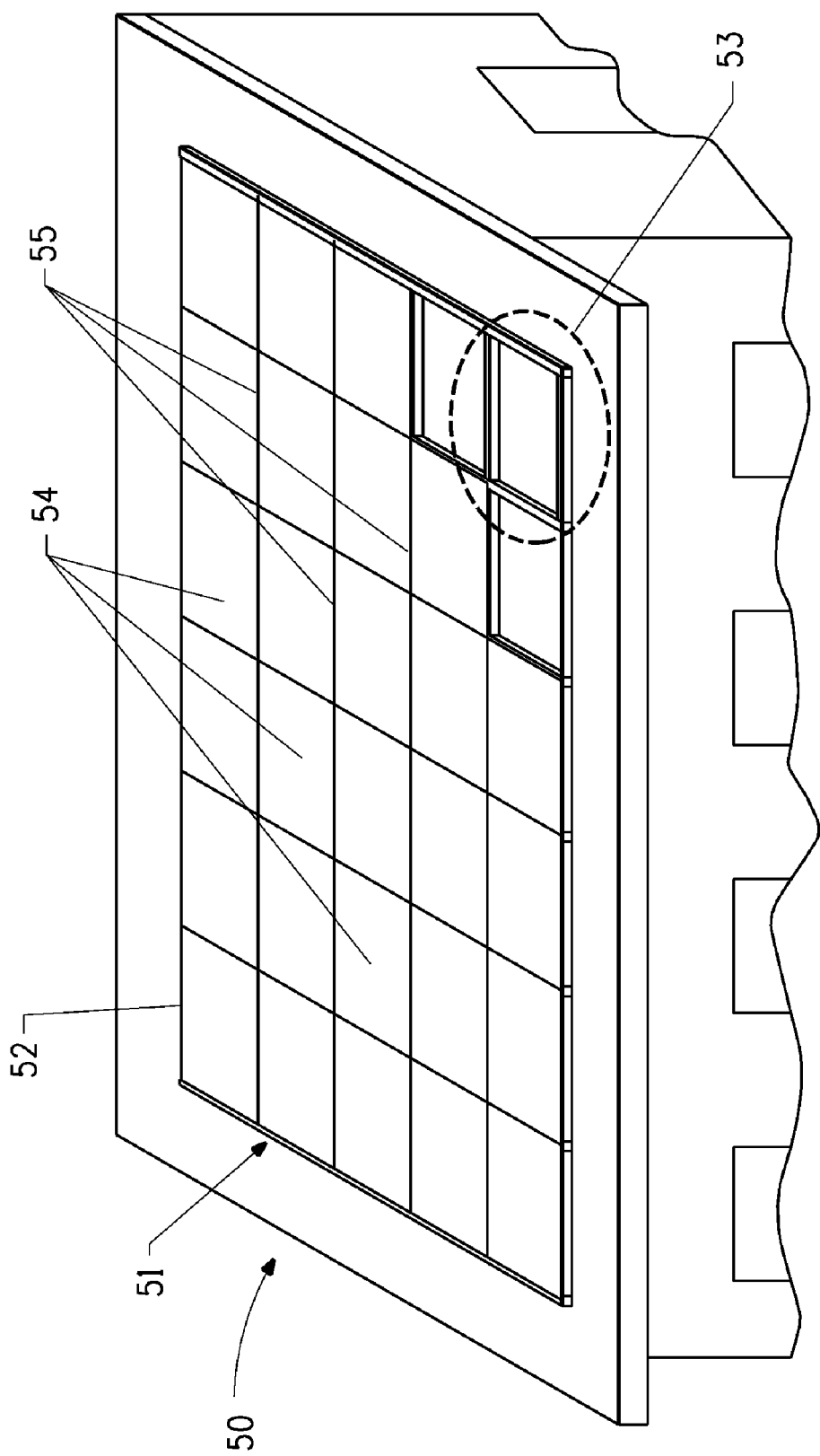
FIG. 4 is a depiction of one embodiment of a photovoltaic array on a residential rooftop.

One embodiment of a photovoltaic array, a residential rooftop array 50, is shown in FIG. 4. A framework 51, made up of an array of openings 53, defined by a series of parallel rails 55, and stiles 52, that are affixed to the rooftop. Individual solar panels, 54, are positioned into the individual openings, and mechanically secured. The framework can be made of metal, wood, or plastic, including reinforced plastic. In one embodiment, the solar panels are connected to one another via the high voltage cables deployed from the junction boxes on the backs of the solar panels, as described above. In other embodiments, the solar panels may be connected via wiring within the framework.

Figure 5:
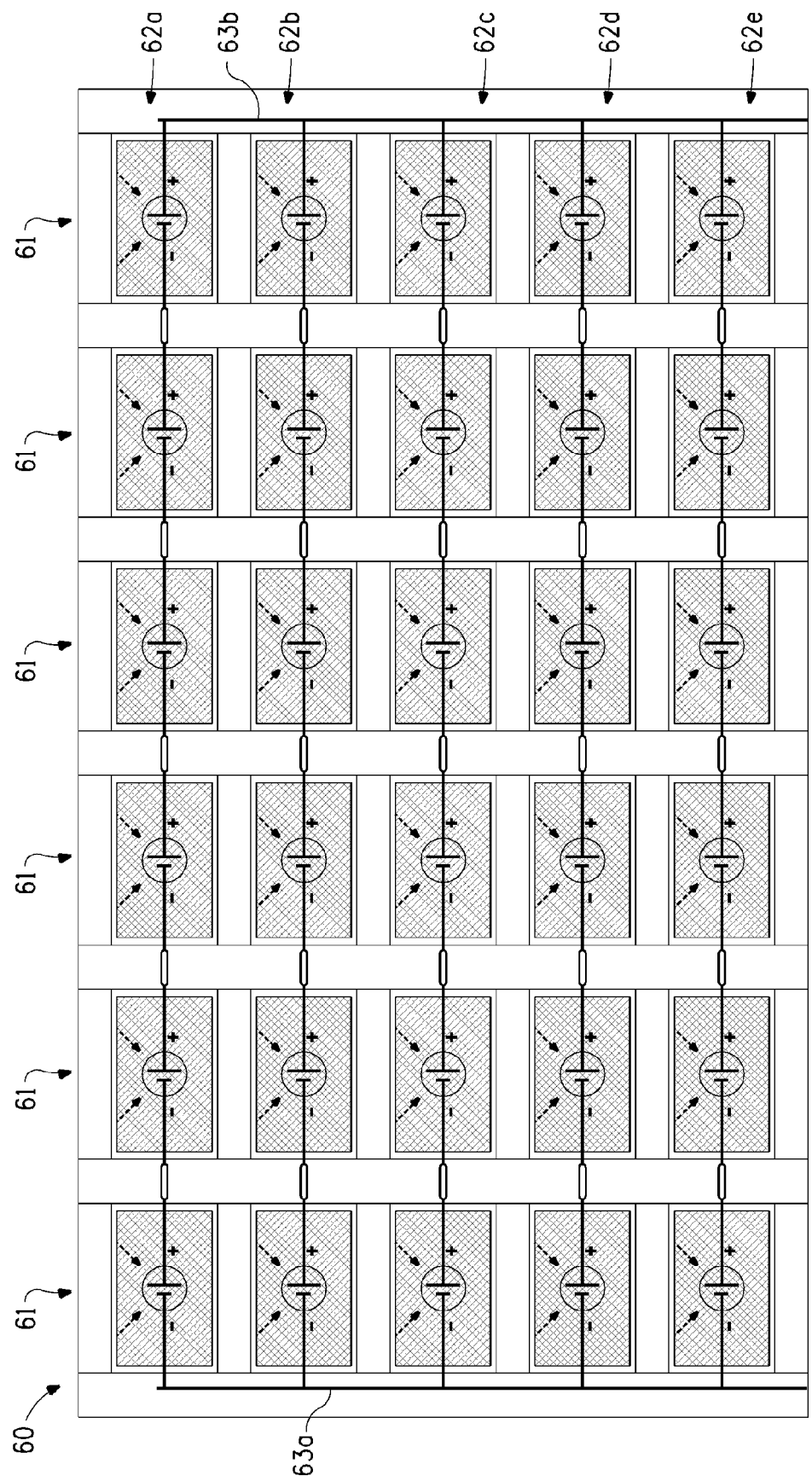
FIG. 5 shows a 5×6 array of solar panels, where 5 series circuits of 6 panels each are connected in parallel.

FIG. 5 shows a 5×6 array of solar panels, 60, where 5 series circuits, 62a-62e, of 6 panels each, 61, are connected in parallel 63a and 63b.

The invention further provides a method for producing electricity, the method comprising illuminating a photovoltaic module with light in the wavelength range from 400 to 1100 nm; and, connecting the thus illuminated photovoltaic module to an electrical load thereby forming an electrical circuit, the photovoltaic module comprising
 a back sheet,
 a front sheet,
 a layer comprising a plurality of photovoltaic cells disposed between the front sheet and the back sheet,
 conductive pathways disposed to combine the electrical output of the plurality of photovoltaic cells into an electrical output from the module;
 an electrical output disposed to interconnect the module with other modules to form a photovoltaic array, or with an external electrical load;
 the back sheet, front sheet, and layer of photovoltaic cells being laminated together
 and wherein the front sheet comprises a glass sheet having a front surface, a multi-layer fluoropolymeric film disposed thereupon, and an adhesive layer disposed between the surface and the film, the multi-layer fluoropolymeric film comprising
  a first fluoropolymeric layer having a refractive index in the range of 1.45 to 1.50, and having a thickness greater than about 10 micrometers, the first fluoropolymeric layer comprising a first fluoropolymer; and a second fluoropolymeric layer having a refractive index of 1.33 to 1.37, and having a thickness in the range of 100 to 150 nanometers, the second fluoropolymeric layer comprising a second fluoropolymer which may be the same as or different from the first fluoropolymer;

with the proviso that the reflectance spectrum of the multilayer fluoropolymeric film exhibit at least one minimum in the wavelength range from 400 to 1100 nm.

The invention is further described in but not limited in scope to the following specific embodiments.

EXAMPLES

Materials/Manufacturers

| | |
|---|---|
| APTMS | Acryloxypropyltrimethoxysilane (Aldrich, 92%) |
| Darocur ® ITX | Mixture of 2-isopropylthioxanthone and 4-isopropylthioxanthone, photoinitiator (Ciba Specialty Chemicals, Tarrytown, NY, USA) |
| Irgacure ® 907 | 2-methyl-1[4-(methylthio)phenyl]-2-morpholinopropan-1-one, photoinitiator (Ciba Specialty Chemicals, Tarrytown, NY, USA) |
| Nissan MEK-ST | Silica colloid in methyl ethyl ketone containing about 0.5 weight percent water, median particle diameter d50 of about 10-16 nm, 30-31 wt % silica, (Nissan Chemical America Co., Houston, TX, USA). |
| Sartomer SR533 | Triallyl isocyanurate, non-fluorinated multiolefinic crosslinker (Sartomer Co., Exton, PA, USA). |
| Viton ® GF200S | Terpolymer of vinylidene fluoride, tetrafluoroethylene, hexafluoropropylene and a cure site monomer(DuPont Performance Elastomers, Wilmington, DE, USA). |
| Elcom DU-1014TIV | Colloidal $TiO_2$ in MIBK with a solids concentration of 20.5 wt-% (Shokubai Kasei Kogyo Kabushiki Kaisha, Japan) |

EXAMPLES

Example 1

Preparation of the Coating Composition 0.4 g of $CH_3COOH(g)$ was added to 100 g of 95% (V) ethanol to form a solution. 32.88 g of the solution so formed was combined with 14.09 g of APTMS and 15.03 g of water to form a hydrolysis solution. The hydrolysis solution was allowed to stand for 24 hours at room temperature.

After standing for 24 hours, 8.29 g of the thus prepared hydrolysis solution was added to 29.29 g of DU-1014TIV $TiO_2$ colloid. The titanium dioxide nanoparticles were approximately 20 nm in median equivalent spherical diameter as measured by dynamic light scattering. The resulting $TiO_2$ solution/dispersion thus prepared was allowed to stand for a further 24 hours at 50° C. prior to further use.

1.75 g of the hydrolysis solution prepared above was combined with 6.61 g of Nissan MEK-ST silica colloid. The $SiO_2$ solution/dispersion thus prepared was allowed stand for 24 hours, at 50° C., prior to further use.

60 g of a 10 wt % solution of Viton® GF200S in MIBK was combined with 0.594 g Sartomer SR533 and 0.356 g Irgacure® 907 in 36.94 g of MIBK to form a curable fluoroelastomer solution.

To the curable fluoroelastomer solution was added 31.32 g of the $TiO_2$ solution/dispersion and 6.96 g of the $SiO_2$ solution/dispersion. The mixture so formed was then filtered through a 0.47µ Teflon® PTFE membrane filter to form the coating composition. The resulting composition was used for coating within two to five hours of preparation. Once mixed the formulation was very stable and did not require further agitation.

Coating

A 22 cm by 10.2 cm strip of Tedlar® PVF film (TUB10AH8, DuPont Company) was coated with the coating composition.

The substrate film was coated with an uncured composition using a Yasui-Seiki Co. Ltd., Tokyo, Japan, Micro Gravure™ coating apparatus. The apparatus included a metering blade and a Yasui-Seiki Co. gravure roll #150 (150 lines/inch) having a roll diameter of 20 mm. The apparatus is shown in FIG. 1.

The coating conditions were adjusted to yield a dried coating (after solvent extraction) providing the lowest reflectance. Conditions were adjust so that the second minimum in the reflectance curve was centered at 770-790 nm. In this experiment, the final coating was carried out using a gravure roll speed of 7.0 rpm and a line speed of 1.0 m/min.

The thus coated substrate was cured using a UV exposure unit supplied by Fusion UV Systems/Gaithersburg Md. consisting of a LH-I6P1 UV source (200 w/cm) coupled to a DRS Conveyer/UV Processor (15 cm wide) with controlled nitrogen inerting capability over a measured range of 10 to 1,000 ppm oxygen.

Lamp power and conveyor speed were set to give a film cure using a measured energy density of 500-600 millijoules/$cm^2$ (UV-A irradiation) at about 0.7 to 1.0 m/min transport rate. An EIT UV Power Puck® radiometer was used to measure the UV total energy in the UV-A band width.

The oxygen level in the unit was controlled using a nitrogen purge to be at 350 ppm or less. The cured film was placed on a metal substrate preheated to 70° C. before placing it on the cure conveyer belt.

Stratification was observed, with both types of particles in the lower stratum on top of the hardcoat substrate.

Lamination to Glass

A 2"×2" specimen of solar grade float glass (Krystal Klear® glass from AFG Industries, Kingsport, Tenn.) was dipped into a solution of 2.5 g of 3-aminopropyltrimethoxysilane, (APS), (Aldrich) dissolved in 2500 g of 95% ethanol, followed by washing with isopropyl alcohol and then dried at 120 C. for 30 minutes.

A 0.003" thick film of Surlyn® 9120 Ionomer Resin (DuPont) provided with a UV stabilization package was placed onto the APS-treated glass surface. The uncoated Tedlar® surface of the coated Tedlar® film prepared above was placed in contact with the Surlyn® film Release sheets of Mellinex® PET films were placed above the Viton® coating and below glass in. The resulting PET/glass/Surlyn®/Tedlar®/Viton®/PET stack was placed between the platens of a vacuum hydraulic press. After evacuation, the press was brought to 150° C. and 2,000 psi pressure and allowed to set for 15 min. Thereafter, the sample was removed from the press and allowed to cool to room temperature.

Figure 6:
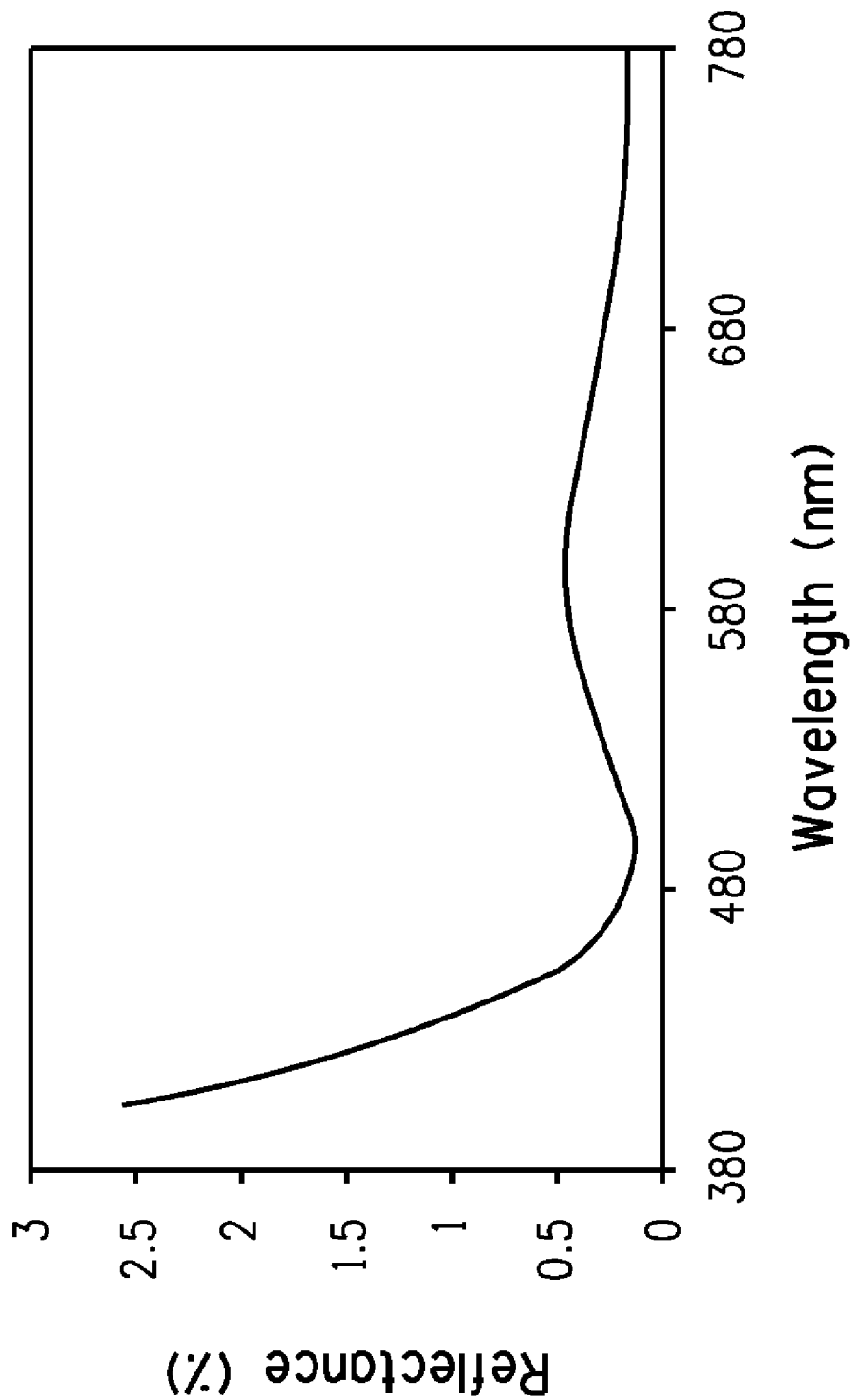
FIG. 6 is the reflectance spectrum obtained from the multi-layer fluoropolymeric film prepared in Example 1.

The reflectance spectrum of the coated film sample so prepared was determined using a Cary 5000 Spectrometer (Varian Inc., Palo Alto, Calif.). FIG. 6 shows the result obtained. Two broad reflectance minima occurred within the visible range, the higher wavelength minimum located in the vicinity of 770 nm.

Photovoltaic Performance

Photovoltaic performance was characterized by determining the current curve using the apparatus schematically depicted in FIG. 5.

Figure 7:
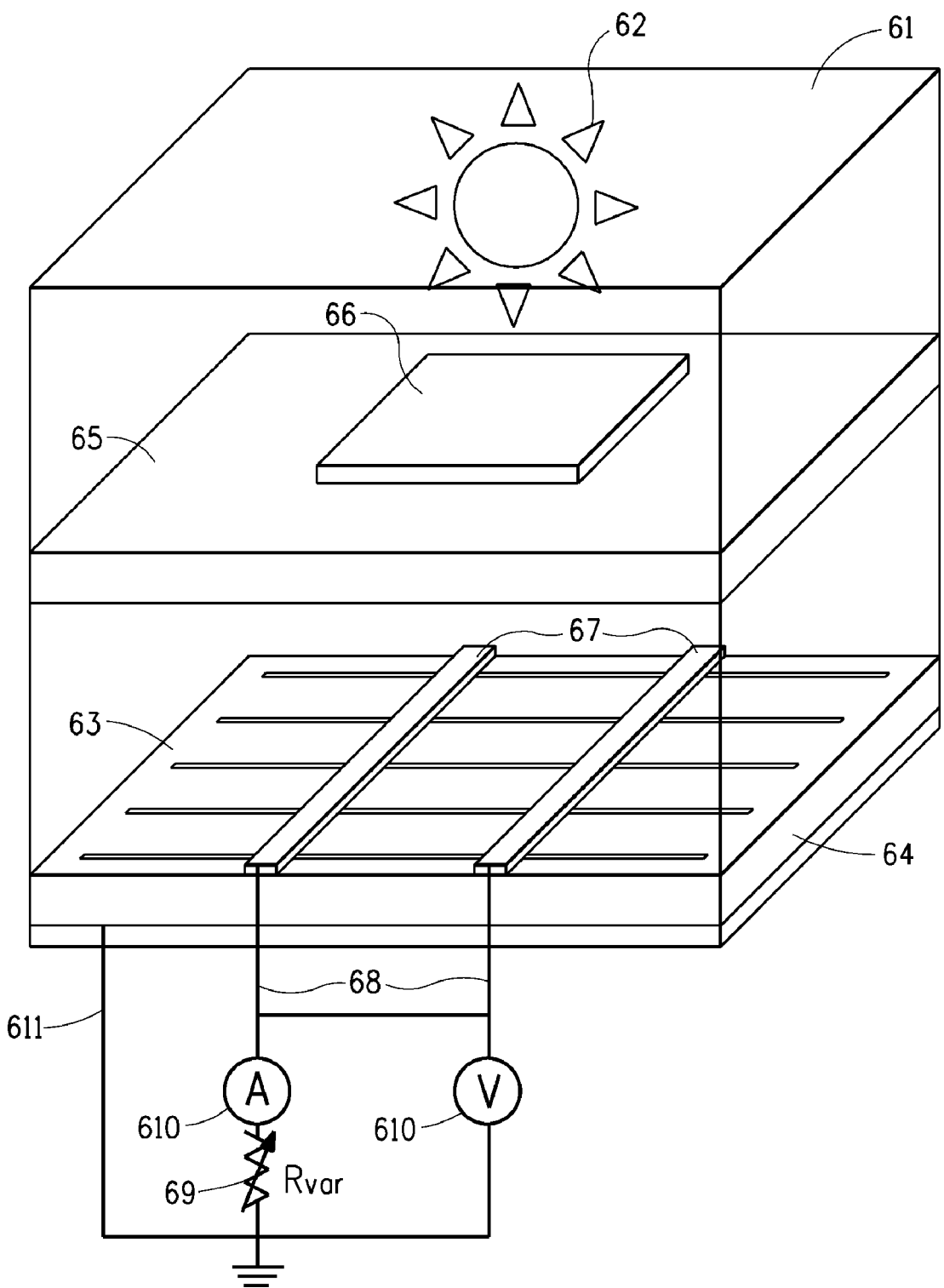
FIG. 7 is a schematic representation of the modified ST-1000 apparatus employed for determining photovoltaic power output.

A ST-1000 solar cell JV tester (Telecom-STV Co., Moscow, Russia) was employed to characterize the effect on performance of a photovoltaic cell of the glass sheet prepared as described supra. As shown schematically in FIG. 7, the entire test apparatus was housed in an opaque housing 61, 10¾"×10¾"×46" in size. The internal surfaces of the enclosure were mirrored. A solar simulator light source consisting of a xenon arc lamp 62 (Philips XOP-70F) fitted with an AM1.5 filter was pulsed to produce illumination intensity at the photovoltaic cell 63 of 1000 W/m$^2$. The lamp 62 was positioned approximately 60 cm above the photovoltaic cell 63. The photovoltaic cell, supplied with the ST-1000, was a bare crystalline silicon cell with an active area of 30 cm$^2$. The photovoltaic cell was positioned on a temperature-controlled table 64 and the temperature was controlled to 24.8° C.

An aluminum masking plate 65 was constructed with an opening 3¾"×3¾" centered in a top face that measures 7"×7". The test specimen 66 was placed directly over the opening. The aluminum plate 65 was supported with two opaque legs (not shown) fabricated from Delrin® polyacetal resin which rested on the temperature controlled table. Rigid metal strips 67 were placed atop the photovoltaic cell 63 such that they contacted the conducting metal connections of the cell. The rigid strips were connected via wires 68 to a variable load 69 and an electronic circuit 610 in the ST-1000 for measuring voltage and current. An additional wire 611 was attached to the bottom metal conductor of the photovoltaic cell to complete the circuit.

The lamp power output was first measured using the photovoltaic cell 63, with no test specimen in place. That is, light that reached the cell passed only through air. The test specimen 66 was then put into place, and another power output determination was made. The specimen was then removed, and again the lamp power output was measured. Only when it was found that the two measurements of lamp power output without the test specimen in place differed from each other by ≦0.7% was the data point considered valid. Five measurements of efficiency were performed for each test specimen, and the mean value of efficiency was determined. The power conversion efficiency of the cell was calculated by dividing the power output by the product of the flash intensity and cell area.

The measured power efficiency was 0.1373%.

Comparative Example A

The same procedure was used as described in Example 1, except that test specimen was a sheet of uncoated KK glass. The measured power efficiency was 0.1360%.

Example 2

The same materials and procedures as described in Example 1 were used except that the coating solution did not contain the nanoparticles. Thus the coating solution was a mixture of 35 g of the Viton® GF200S in MIBK, 0.347 g Sartomer SR533, 0.208 g Irgacure® 907 and 30.69 g of MIBK.

The coating procedures of Example 1 were followed This solution was used to coat onto the Tedlar substrate as described in Example 1. The Micro Gravure™ roll was set at 9 rotations/minute. The resultant coated film was then laminated to KK glass as in Example 1.

Figure 8:
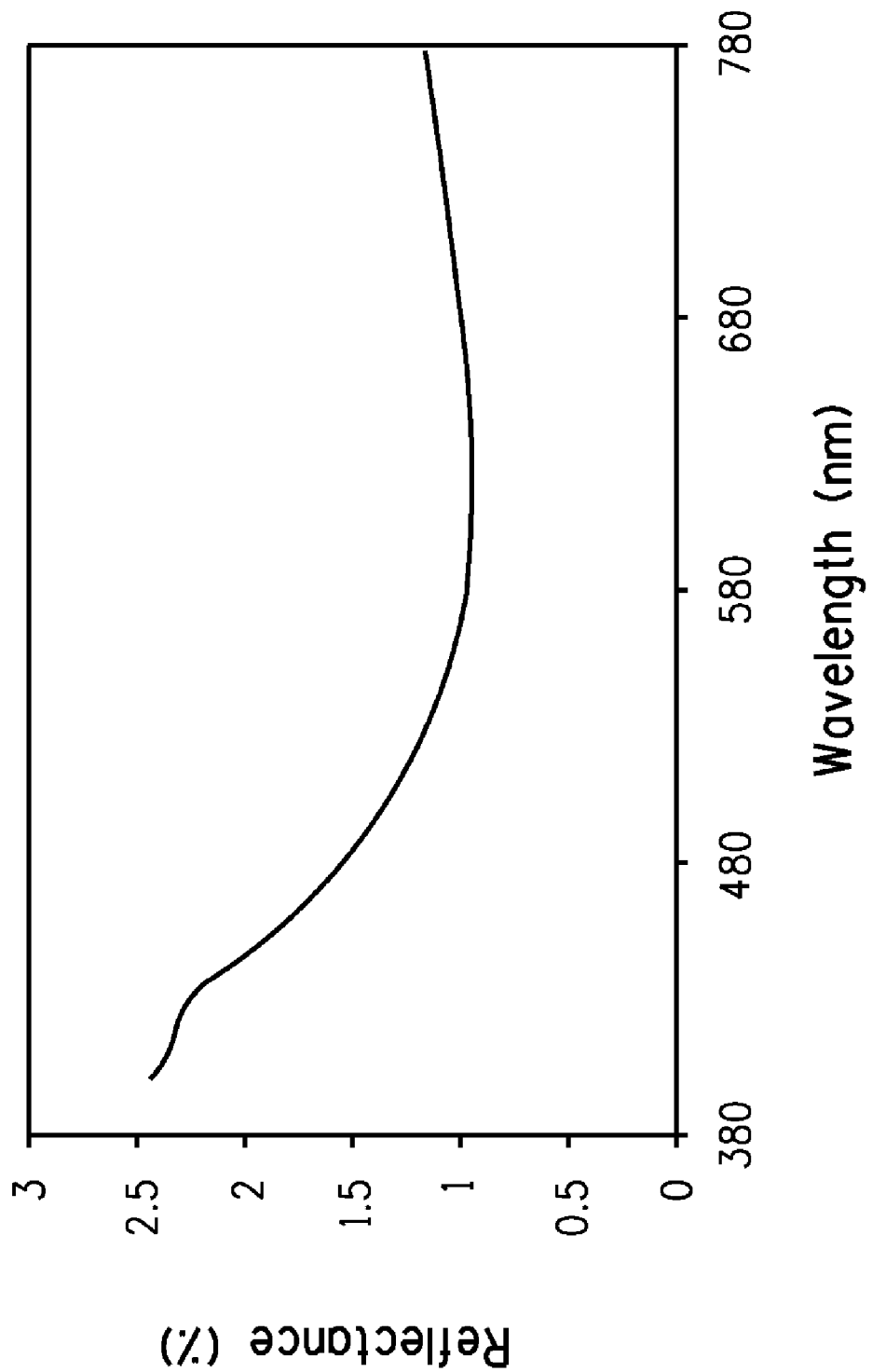
FIG. 8 is the reflectance spectrum obtained from the multi-layer fluoropolymeric film prepared in Example 2.

The reflectance spectrum of the prepared coated film sample is shown in FIG. 8.

What is claimed is:

1. A photovoltaic module comprising
a back sheet,
a front sheet,
a layer comprising a plurality of photovoltaic cells disposed between the front sheet and the back sheet,
conductive pathways disposed to combine the electrical output of the plurality of photovoltaic cells into an electrical output from the module; and,
an electrical output disposed to interconnect the module with other modules to form a photovoltaic array, or with an external electrical load;
the back sheet, front sheet, and layer of photovoltaic cells being laminated together; and
wherein the front sheet comprises a glass sheet having a front surface, a multi-layer fluoropolymeric film disposed on the front surface, and an adhesive layer disposed between the front surface and the multi-layer fluoropolymeric film, the multi-layer fluoropolymeric film comprising
a first fluoropolymeric layer having a refractive index of 1.45 to 1.50 and a thickness greater than about 10 micrometers, the first fluoropolymeric layer comprising a first fluoropolymer; and
a second fluoropolymeric layer having a refractive index of 1.33 to 1.37 and a thickness of 100 to 150 nanometers, the second fluoropolymeric layer comprising a second fluoropolymer;
with the proviso that the reflectance spectrum of the multi-layer fluoropolymeric film exhibits at least one minimum in the wavelength between 400 and 1100 nm.

2. The photovoltaic module of claim 1 wherein the multi-layer fluoropolymeric film further comprises a third fluoropolymeric layer disposed between the first fluoropolymeric layer and the second fluoropolymeric layer and in adhering contact with both, the third fluoropolymeric layer comprising a third fluoropolymer and 50 to 60 vol-% of one or more nano-scale particulate inorganic oxides or nitrides, the third fluoropolymeric layer having a refractive index of 1.50 to 1.70 and a thickness of 1 to 240 nanometers.

3. The photovoltaic module of claim 2 wherein the second and third fluoropolymers are the same.

4. The photovoltaic module of claim 3 wherein the third fluoropolymer is a cross-linked terpolymer comprising monomer units of vinylidene fluoride, hexafluoropropylene, and tetrafluoroethylene, wherein 50-85% of monomer units are derived from vinylidene fluoride.

5. The photovoltaic module of claim 4 wherein the second fluoropolymeric layer and the third fluoropolymeric layer are disposed in a single stratified film layer, the stratified film layer having a polymer-poor bottom stratum and a polymer-rich top stratum, the bottom stratum adheringly contacting the first fluoropolymeric layer, the bottom stratum comprising the second fluoropolymer and the one or more particulate nano-scale inorganic oxides or nitrides, the bottom stratum having a refractive index of 1.50 to 1.70; the top stratum comprising the second fluoropolymer and having a refractive index of 1.33 to 1.37; and wherein the one or more inorganic oxides or nitrides are surface functionalized with an acryloyl siloxyl radical represented by the formula

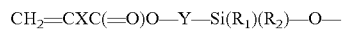

where X is H or Me, Y is a divalent organic radical, selected from substituted and unsubstituted C2-C10 alkylene radicals, and substituted or unsubstituted C6-C20 arylene groups, that can comprise ether, ester, or amide linkages; and $R_1$ and $R_2$ are independently selected from the group consisting of C1-C20 alkoxy, C6-C20 aryloxy, C1-C20 alkyl, C6-C20 aryl, C7-C30 aralkyl, C7-C30 alkaryl, halogen, and hydrogen.

6. The photovoltaic module of claim 5 wherein Y is —$CH_2$—$CH_2$—$CH_2$—, and $R_1$ and $R_2$ are methoxy.

7. The photovoltaic module of claim 1 wherein the adhesive consists essentially of an ionomer.

8. The photovoltaic module of claim 2 wherein the particulate nano-scale inorganic oxide comprises $ZrO_2$.

9. A photovoltaic array comprising
a support structure;
a plurality of electrically interconnected photovoltaic modules mechanically affixed to the support structure, each photovoltaic module comprising,
a back sheet;
a front sheet;
a layer comprising a plurality of photovoltaic cells disposed between the front sheet and the back sheet;
conductive pathways disposed to combine the electrical output of the plurality of photovoltaic cells into an electrical output from the module;
an electrical output disposed to interconnect the module with other modules to form the photovoltaic array;
the back sheet, front sheet, and layer of photovoltaic cells being laminated together; and
wherein the front sheet comprises a glass sheet having a front surface, a multi-layer fluoropolymeric film disposed on the front surface, and an adhesive layer disposed between the front surface and the multi-layer fluoropolymeric film, the multi-layer fluoropolymeric film comprising
a first fluoropolymeric layer having a refractive index of 1.45 to 1.50 and a thickness greater than about 10 micrometers, the first fluoropolymeric layer comprising a first fluoropolymer; and
a second fluoropolymeric layer having a refractive index of 1.33 to 1.37 and a thickness of 100 to 150 nanometers, the second fluoropolymeric layer comprising a second fluoropolymer;
with the proviso that the reflectance spectrum of the multi-layer fluoropolymeric film exhibits at least one minimum between 400 and 1100 nm; and
an electrical output to permit connection to an external electrical circuit.

10. The photovoltaic array of claim 9 wherein the multi-layer fluoropolymeric film further comprises a third fluoropolymeric layer disposed between the first fluoropolymeric layer and the second fluoropolymeric layer and in adhering contact with both, the third fluoropolymeric layer comprising a third fluoropolymer and 50 to 60 vol-% of one or more nano-scale particulate inorganic oxides or nitrides, the third fluoropolymeric layer having a refractive index of 1.50 to 1.70 and a thickness of 1 to 240 nanometers.

11. The photovoltaic array of claim 10 wherein the second and third fluoropolymers are the same.

12. The photovoltaic array of claim 11 wherein the third fluoropolymer is a cross-linked terpolymer comprising monomer units of vinylidene fluoride, hexafluoropropylene, and tetrafluoroethylene, wherein 50-85% of monomer units are derived from vinylidene fluoride.

13. The photovoltaic array of claim 12 wherein the second fluoropolymeric layer and the third fluoropolymeric layer are disposed in a single stratified film layer, the stratified film layer having a polymer-poor bottom stratum and a polymer-rich top stratum, the bottom stratum adheringly contacting the first fluoropolymeric layer, the bottom stratum comprising the second fluoropolymer and the one or more particulate nano-scale inorganic oxides or nitrides, the bottom stratum having a refractive index of 1.50 to 1.70; the top stratum comprising the second fluoropolymer and having a refractive index of 1.33 to 1.37; and wherein the one or more inorganic oxides or nitrides are surface functionalized with an acryloyl siloxyl radical represented by the formula

where X is H or Me, Y is a divalent organic radical, selected from substituted and unsubstituted C2-C10 alkylene radicals, and substituted or unsubstituted C6-C20 arylene groups comprising ether, ester, or amide linkages; and $R_1$ and $R_2$ are independently selected from the group consisting of C1-C20 alkoxy, C6-C20 aryloxy, C1-C20 alkyl, C6-C20 aryl, C7-C30 aralkyl, C7-C30 alkaryl, halogen, and hydrogen.

14. The photovoltaic array of claim 13 wherein Y is $CH_2$—$CH_2$—$CH_2$— and $R_1$ and $R_2$ are methoxy.

15. The photovoltaic array of claim 9 wherein the adhesive consists essentially of an ionomer.

16. The photovoltaic array of claim 10 wherein the particulate nano-scale inorganic oxide comprises $ZrO_2$.

17. A method comprising illuminating a photovoltaic module with light in the wavelength range from 400 to 1100 nm; and, connecting the thus illuminated photovoltaic module to an electrical load thereby forming an electrical circuit, the photovoltaic module comprising:
a back sheet;
a front sheet;
a layer comprising a plurality of photovoltaic cells disposed between the front sheet and the back sheet;
conductive pathways disposed to combine the electrical output of the plurality of photovoltaic cells into an electrical output from the module;
an electrical output disposed to interconnect the module with other modules to form a photovoltaic array, or with an external electrical load;
the back sheet, front sheet, and layer of photovoltaic cells being laminated together; and
wherein the front sheet comprises a glass sheet having a front surface, a multi-layer fluoropolymeric film disposed on the front surface, and an adhesive layer disposed between the front surface and the multi-layer fluoropolymeric film, the multi-layer fluoropolymeric film comprising
a first fluoropolymeric layer having a refractive index of 1.45 to 1.50 and a thickness greater than about 10 micrometers, the first fluoropolymeric layer comprising a first fluoropolymer; and
a second fluoropolymeric layer having a refractive index of 1.33 to 1.37 and a thickness of 100 to 150 nanometers, the second fluoropolymeric layer comprising a second fluoropolymer;
with the proviso that the reflectance spectrum of the multi-layer fluoropolymeric film exhibits at least one minimum between 400 and 1100 nm.

18. The method of claim 17 wherein the multi-layer fluoropolymeric film further comprises a third fluoropolymeric layer disposed between the first fluoropolymeric layer and the second fluoropolymeric layer and in adhering contact with both, the third fluoropolymeric layer comprising a third fluoropolymer and 50 to 60 vol-% of one or more nano-scale particulate inorganic oxides or nitrides, the third fluoropolymeric layer having a refractive index of 1.50 to 1.70 and a thickness of 1 to 240 nanometers.

19. The method of claim 18 wherein the second and third fluoropolymers are the same.

20. The method of claim 19 wherein the third fluoropolymer is a cross-linked terpolymer of monomer units comprising vinylidene fluoride, hexafluoropropylene, and tetrafluoroethylene, wherein 50-85% of the monomer units are derived from vinylidene fluoride.

21. The method of claim 20 wherein the second fluoropolymeric layer and the third fluoropolymeric layer are disposed in a single stratified film layer, the stratified film layer having a polymer-poor bottom stratum and a polymer-rich top stratum, the bottom stratum adheringly contacting the first fluoropolymeric layer, the bottom stratum comprising the second fluoropolymer and the one or more particulate nano-scale inorganic oxides or nitrides, the bottom stratum having a refractive index of 1.50 to 1.70; the top stratum comprising the second fluoropolymer and having a refractive index of 1.33 to 1.37; and wherein the one or more inorganic oxides or nitrides are surface functionalized with an acryloyl siloxyl radical represented by the formula

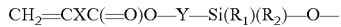

where X is H or Me, Y is a divalent organic radical, selected from substituted and unsubstituted C2-C10 alkylene radicals, and substituted or unsubstituted C6-C20 arylene groups that can comprise ether, ester, or amide linkages; and $R_1$ and $R_2$ are independently selected from the group consisting of C1-C20 alkoxy, C6-C20 aryloxy, C1-C20 alkyl, C6-C20 aryl, C7-C30 aralkyl, C7-C30 alkaryl, halogen, and hydrogen.

22. The method of claim 21 wherein Y is $CH_2$—$CH_2$—$CH_2$—, and $R_1$ and $R_2$ are methoxy.

23. The method of claim 17 wherein the adhesive consists essentially of an ionomer.

24. The method of claim 18 wherein the particulate nano-scale inorganic oxide comprises $ZrO_2$.

* * * * *